United States Patent
Lammers

(10) Patent No.: US 6,972,989 B2
(45) Date of Patent: Dec. 6, 2005

(54) REFERENCE CURRENT DISTRIBUTION IN MRAM DEVICES

(75) Inventor: Stefan Lammers, South Burlington, VT (US)

(73) Assignee: Infincon Technologies AG, Munich (DE)

( * ) Notice: Subject to any disclaimer, the term of this patent is extended or adjusted under 35 U.S.C. 154(b) by 131 days.

(21) Appl. No.: 10/683,965

(22) Filed: Oct. 10, 2003

(65) Prior Publication Data

US 2005/0078531 A1    Apr. 14, 2005

(51) Int. Cl.[7] .............................................. G11C 11/14
(52) U.S. Cl. ........................ 365/171; 365/158; 365/210
(58) Field of Search ................................ 365/171, 158, 365/210, 209, 55, 66

(56) References Cited

U.S. PATENT DOCUMENTS

| 4,990,797 | A  |    | 2/1991  | Real et al.  |
|-----------|----|----|---------|--------------|
| 5,739,718 | A  |    | 4/1998  | Chevroulet   |
| 6,490,194 | B2 |    | 12/2002 | Hoenigschmid |
| 6,584,006 | B2 |    | 6/2003  | Viechmann    |
| 6,594,176 | B2 |    | 7/2003  | Lammers      |
| 6,594,191 | B2 |    | 7/2003  | Lammers et al. |
| 6,856,565 | B2 | *  | 2/2005  | Ooishi et al. ................ 365/210 |
| 2002/0018360 | A1 |    | 2/2002  | Hartmann |
| 2002/0097602 | A1 |    | 7/2002  | Lammers |

FOREIGN PATENT DOCUMENTS

EP              1 182 666 A1    2/2002

* cited by examiner

*Primary Examiner*—David Lam
(74) *Attorney, Agent, or Firm*—Slater & Matsil, L.L.P.

(57) ABSTRACT

A reference current distribution method and structure thereof for MRAM devices. An MRAM array includes current reference paths with substantially uniform length and resistance for all current paths flowing from the global reference current generator (GRCG) to a plurality of local current generators (LCGs), each LCG being coupled to at least one sub-array. The conductive wire segments that couple the LCGs to the GRCG are positioned such that all reference current path lengths from the GRCG to each LCG are substantially the same, ensuring that the resistance of all reference current paths is substantially the same and the amount of reference current provided by the GRCG to the LCGs is substantially the same. An advantage of an embodiment of present invention may be that the write margin is increased for the MRAM chip.

27 Claims, 4 Drawing Sheets

REFERENCE CURRENT DISTRIBUTION IN MRAM DEVICES

TECHNICAL FIELD

The present invention relates generally to the fabrication of semiconductor devices, and more particularly to magnetic random access memory (MRAM) devices.

BACKGROUND

Generally, semiconductors are used for integrated circuits for electronic applications, including radios, televisions, and personal computing devices, as examples. One type of semiconductor device is a semiconductor storage device, such as a dynamic random access memory (DRAM) and flash memory, which use an electron charge to store information.

A more recent development in memory devices involves spin electronics, which combines semiconductor technology and magnetics. The spin of an electron, rather than the charge, is used to indicate the presence of a "1" or "0". One such spin electronic device is a magnetic random-access memory (MRAM) device, which includes conductive lines positioned perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is stored in the alignment of magnetic moments.

The resistance of the magnetic component depends on the moment's alignment. The stored state is read from the element by detecting the component's resistive state. A memory cell may be constructed by placing the conductive lines and cross-points in a matrix or array structure having rows and columns.

The read and write operations of MRAM devices rely on current in principle rather than voltage. As such, MRAM designs are sensitive to current. An example of this is U.S. Pat. No. 6,594,176, which is incorporated herein by reference, in which the resistance of the bitline and wordline write paths are balanced to create a uniform current across all conductive wires in the memory cell array, thereby improving the write margin of the MRAM chip.

One challenge in the design of MRAM devices is the even distribution of reference current. Local current generators (LCGs) use a global current as a reference with which to generate wordline and bitline currents in a memory cell array. An uneven distribution of global current may therefore cause the amplitude of the currents in the wordlines and bitlines in a memory cell array to be non-uniform across all lines. The write margin in an MRAM device can be improved by ensuring an even distribution of current to all wordline and bitline current generators thereby improving the write margin of each cell in each MRAM memory cell array.

SUMMARY OF THE INVENTION

Embodiments of the present invention achieve technical advantages by providing a method and structure of distributing reference current evenly in an MRAM device.

In accordance with a preferred embodiment of the present invention, a semiconductor device includes a plurality of circuit sections, a plurality of local current generators (LCGs), each LCG being coupled to at least one of the circuit sections, and a global reference current generator (GRCG), each LCG being coupled to the GRCG through a plurality of conductive lines, wherein the resistance of the conductive lines between each LCG and the GRCG is substantially the same.

In accordance with another preferred embodiment of the present invention, an MRAM device includes a plurality of sub-arrays, each sub-array comprising a plurality of magnetic memory cells, a plurality of first conductive lines disposed beneath the magnetic memory cells, the first conductive lines being positioned in a first direction, and a plurality of second conductive lines disposed above the magnetic memory cells, the second conductive lines being positioned in a second direction. An LCG is coupled to each sub-array, and GRCG is coupled to each LCG through a plurality of third conductive lines, wherein the resistance of the third conductive lines between each LCG and the GRCG is substantially the same.

In accordance with yet another preferred embodiment of the present invention, a method of distributing current in a semiconductor memory device comprising a plurality of LCGs coupled to a GRCG is disclosed. The method includes flowing current through a first current path from the GRCG to a first LCG, and flowing current through a second current path from the GRCG to a second LCG, the second current path having the same resistance as the first current path.

Embodiments of the present invention achieve technical advantages by providing a reference current distribution for an MRAM array wherein the reference current at the input of each LCG is substantially the same. Because the length and resistance of the reference current path between the GRCG and each LCG is substantially the same, the reference current is also the same at the input of each LCG. The even reference current distribution to the LCGs of an MRAM array provided by embodiments of the present invention herein results in more reliable write operations due to achieving the same write currents for each memory cell in the array for an MRAM memory device. The write margin for an MRAM device is increased.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an MRAM array. Embodiments of the invention may also be applied, however, to other memory devices or circuits where it is desirable for a substantially equal current to be provided to different parts of the device. For example, the reference current distribution scheme herein can be applied to any circuit having a reference current that needs to be distributed.

Figure 1:
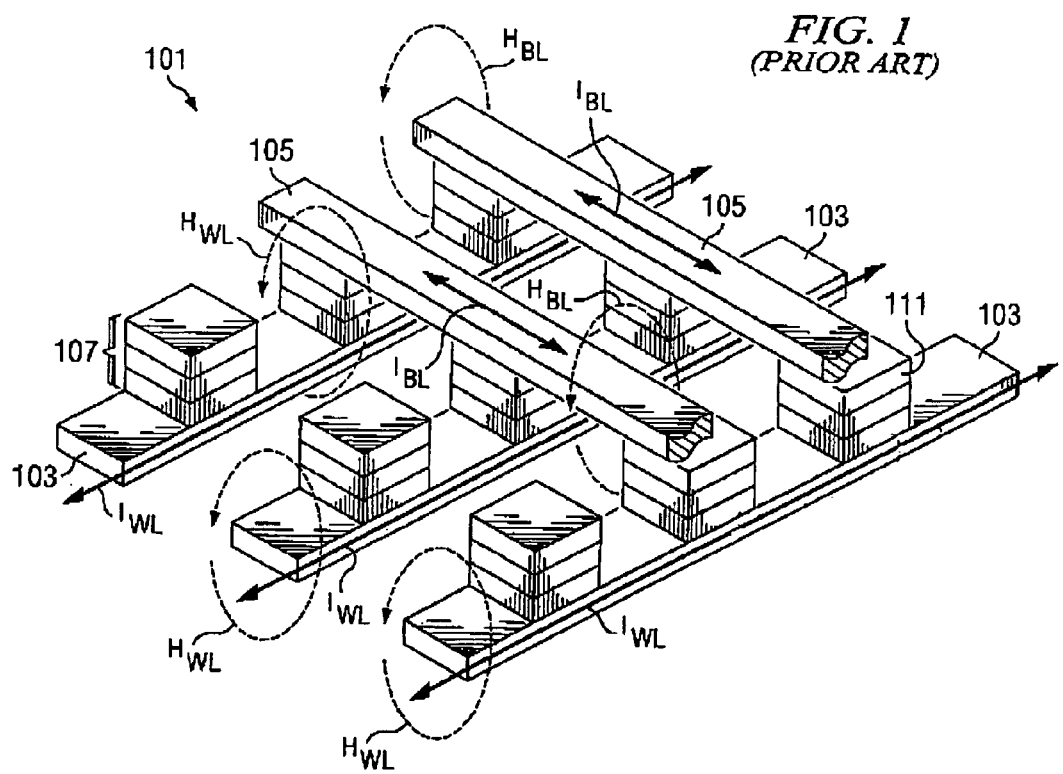
FIG. 1 illustrates a perspective view of a prior art MRAM device having magnetic stack memory cells arranged in an array, with wordlines and bitlines disposed below and above each memory cell for accessing the memory cells.
Figure 2:
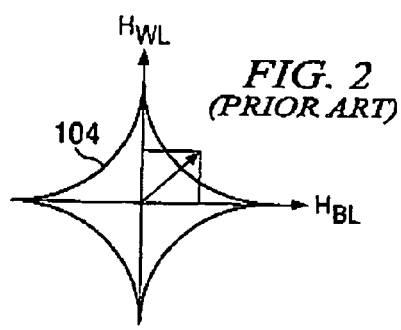
FIG. 2 shows an asteroid curve representing switching characteristics of an MRAM cell.

MRAM memory cells 107 shown in FIG. 1 have a switching characteristic in the shape of an asteroid curve 104, as shown in FIG. 2. The asteroid curve 104 is defined by Eq. 1:

$$H_{WL}^{2/3} + H_{BL}^{2/3} = H_K^{2/3}, \qquad \text{Eq. 1}$$

where $H_K$ is the coercivity, and $H_{WL}$ and $H_{BL}$ are the magnetic fields generated by the currents of a wordline 103 and bitline 105, respectively. To switch the soft magnetic layer 111 of the cell, the superposition of the bitline field $H_{BL}$ and wordline $H_{WL}$ fields have to be large enough to go outside the asteroid curve 104. In the soft magnetic layer 111, one of these fields, referred to as the easy axis field, which in this example is $H_{BL}$ along the horizontal axis in FIG. 2, is oriented parallel to the switching axis. The other field, called the hard axis field, is oriented orthogonal to the switching axis, which in this example is $H_{WL}$ along the y axis.

A problem in MRAM memory arrays is that the asteroid curves of the different MRAM cells in an array are not ideal, as in the asteroid curve 104 shown in FIG. 2. There are many parameters that influence the shape of asteroid curves. Some of these parameters comprise the physical shape of the cell or the roughness of the different layers, as examples. There are other unknown parameters that may also affect the shape of the asteroid curve 104. A more realistic switching characteristic of an MRAM memory cell would appear more like the curve 106 shown in FIG. 3. To ensure that an MRAM memory cell is switched (e.g., written), the magnetic field has to be large enough to go outside the realistic asteroid curve 106.

If the region between the ideal asteroid curve 104 and the realistic asteroid curve 106 is reached during a write operation, this introduces uncertainty in the write operation because some MRAM memory cells may be written, while other MRAM memory cells in the array may not be written by this magnetic field. This may result in the loss of data in the MRAM device, because an MRAM memory cell that was intended to be written would not be. Also, to make sure that an MRAM memory cell is not written, the magnetic field applied on an MRAM memory cell must not go outside the ideal asteroid curve 104.

Figure 3:
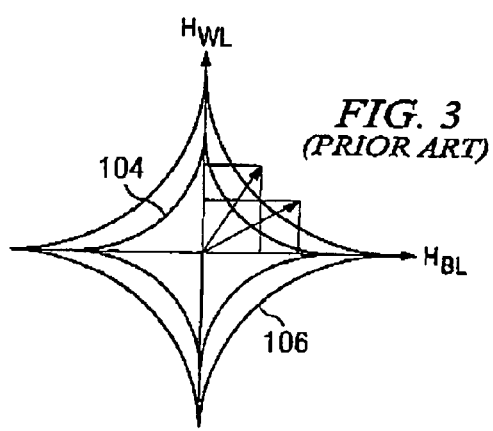
FIG. 3 shows a realistic asteroid curve demonstrating the difficulty in writing to the different MRAM memory cells of an MRAM array.

In an MRAM array 101 a plurality of MRAM memory cells 107 are positioned at cross-points of a plurality of wordlines 103 and bitlines 105. In a standard cross-point MRAM array 101 or a standard transistor MRAM array (not shown), the magnetic field generated by the wordline current $I_{WL}$ and the magnetic field generated by the bitline current $I_{BL}$ is applied on all MRAM memory cells 107 along a wordline 103 or bitline 105. Only the MRAM memory cell 107 or cells that receive the wordline magnetic fields $H_{WL}$ and the bitline magnetic fields $H_{BL}$ should be written. The realistic asteroid curve 106 shown in FIG. 3 illustrates that it is difficult to write only the selected MRAM memory cells 107 in prior art MRAM array 101 architectures.

Figure 4:
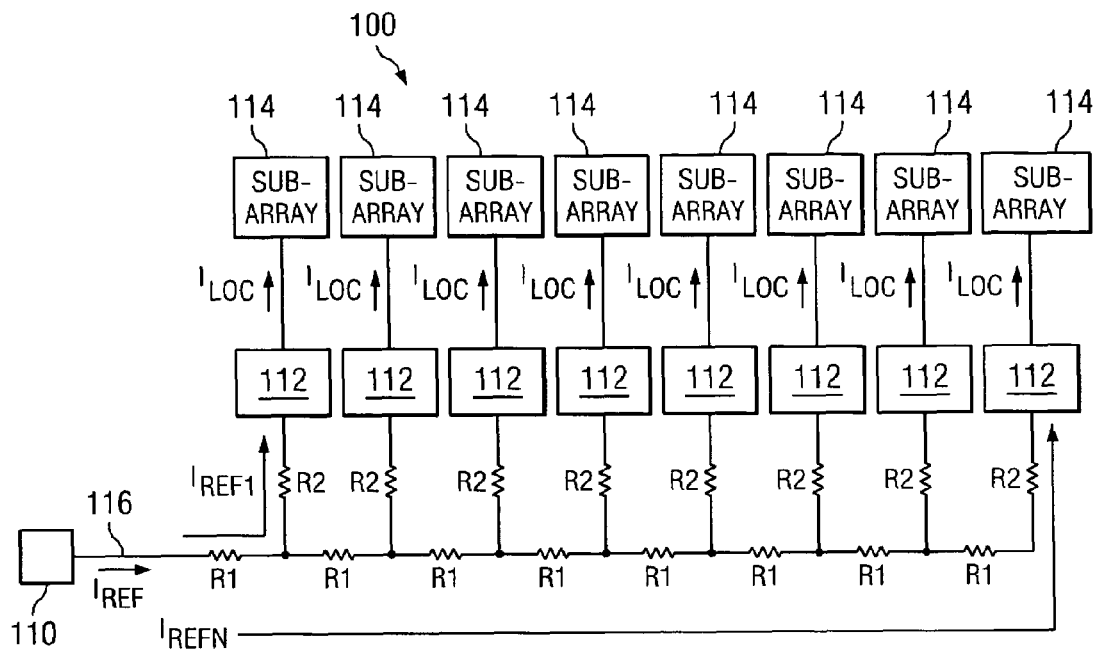
FIG. 4 shows a prior art current distribution configuration of an MRAM array, with a global control reference generator (GCRG) coupled to a plurality of local current generators (LCGs), wherein the resistance for the reference conductive lines varies according to the distance between the GRCG and the LCGs.

On many memory chips, a band gap reference circuit (not shown) is often used to provide a reference voltage and/or a reference current that is relatively insensitive to temperature variations. FIG. 4 shows a prior art architecture for reference current distribution in an MRAM array. In such an MRAM memory array 100, a band gap reference circuit is typically used to generate a reference voltage level for a global reference current generator (GRCG) 110 that is adapted to generate a global reference current $I_{REF}$, as shown in FIG. 4. Because the global reference current $I_{REF}$ is sent over a large surface area of the MRAM memory array 100 to a plurality of local current generators (LCGs) 112, it is not desirable to distribute a large amount of current over the entire chip due to power consumption and high voltage drop, especially when using a low supply voltage on the chip. If the input nodes of the LCG 122 remain constantly charged, then current is constantly consumed, which increases power consumption for the MRAM array 100. MRAMs are planned for use in battery-powered applications such as cellular phones; therefore, low power consumption of the MRAM memory cells is important, to prolong battery life.

In order to reduce power consumption close to the sub-arrays 114 of the MRAM memory array 100, each LCG 112 generates a local write current $I_{LOC}$, which is used in each sub-array 114 to write or store information to the MRAM memory cells. The local write current $I_{LOC}$ is shown in FIG. 4 as a single current or signal; however, the current $I_{LOC}$ may actually represent two write currents $I_{WL}$ and $I_{BL}$ for the wordlines and bitlines, respectively, of the sub-arrays 114. The bitline current for each sub-array 114 may alternatively comprise two separate bitline currents, one flowing one way, and the other flowing in an opposite direction. The global reference current $I_{REF}$ may be orders of magnitude smaller than the local write current $I_{LOC}$. For example, $I_{LOC}$ may be about 100 times larger than $I_{REF}$. The current $I_{REF}$ may comprise a single reference current from which the write currents $I_{WL}$ and $I_{BL}$ are generated. Alternatively, there may be two or three reference currents $I_{REF}$, one for each write current $I_{WL}$ or $I_{BL}$. Each sub-array 114 includes a plurality of magnetic memory cells, wordlines and bitlines (not shown).

A problem with the reference current distribution in the MRAM array 100 shown in FIG. 4 is that the reference current $I_{REF}$ conductive lines 116 have a greater length for the LCGs 112 farther away from the GRCG 110 than for the LCGs 112 closer to the GRCG 110. For purposes of discussion, the segments of the reference current conductive line 116 along the bottom of the array are presumed to have a relatively equal resistance $R_1$, and the segments leading to each LCG 112 are presumed to have a relatively equal resistance $R_2$, for example. However, the resistances $R_1$ and $R_2$ may vary and are dependent on the length, width, and materials used for the conductive lines 116, for example.

The total resistance for the path for $I_{REF1}$ from the GRCG 110 to the closest LCG 112 comprises the sum of $(1*R_1)$ and $R_2$, whereas the total resistance for the path for $I_{REFN}$ from the GRCG 110 to the LCG 112 farthest from the GRCG 110 comprises the sum of $(8*R_1)$ and $R_2$. This presents a problem, because the reference current $I_{REFN}$ is lower than the reference current $I_{REF1}$, causing a non-uniform distribution of current to the LCGs 112 in the MRAM array 100. This can result in reduced write currents $I_{LOC}$ being generated by the LCGs 112 farthest from the GRCG 110, possibly resulting in magnetic memory cells in the sub-array 114 not being written to. This may result in the loss of data in the memory cell, and a less than optimal write margin for the chip.

Embodiments of the present invention achieve technical advantages by ensuring that the input of each LCG receives the same amount of reference current, thereby ensuring that each magnetic memory cell in the plurality of sub-arrays receives the same amount of write current, increasing the write margin of the chip. The chip will achieve an increased write margin when a constant reference voltage is applied to each LCG. The wiring of the GRCG to the LCGs in the array comprises a configuration such that the length of the reference current path to one LCG is substantially the same as the lengths of the reference current paths to all other LCGs in the array.

Figure 5:
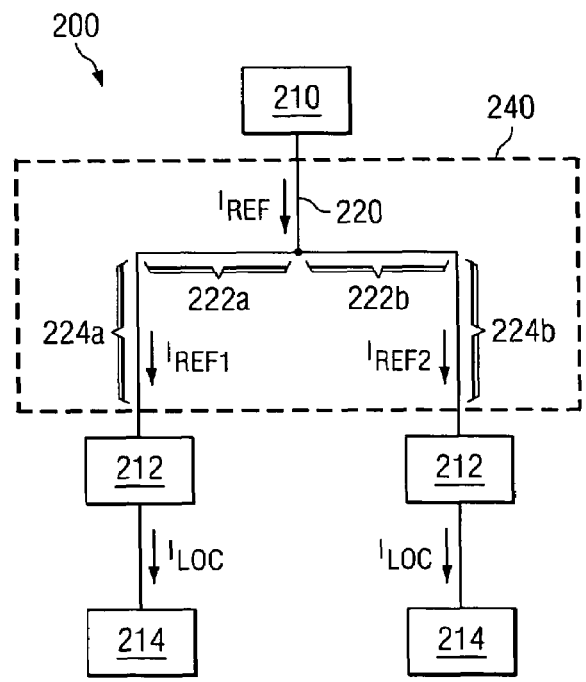
FIG. 5 shows an embodiment of the present invention with a GCRG coupled to a plurality of LCGs, wherein the LCGs are arranged in a row or column and wherein the resistance for the reference conductive lines is substantially the same regardless of the distance between the GRCG and the LCGs.

FIG. 5 shows an embodiment of the present invention, wherein a global reference current generator (GRCG) 210 generates a current that is evenly distributed to two local current generators (LCG) 212 through a conductive wire segment configuration 240. Each LCG 212 is coupled to at least one sub-array 214, as shown. A reference current $I_{REF}$ generated by the GRCG 210 flows along conductive wire segment 220 and is distributed into the conductive wire segments 222a and 222b. The sum of the lengths of conductive wire segments 222b and 224b are substantially the same as the sum of the lengths of conductive wire segments 222a and 224a. Furthermore, the lengths of conductive wire segments 222a and 222b are substantially the same, and the lengths of conductive wire segments 224a and 224b ate substantially the same. The resistance along a conductive path is directly related to the length of that path; therefore, if the lengths of the wire segments are substantially equal, the resistances of the wire segments are also substantially equal, assuming the characteristics of the conductor are substantially the same. Therefore, since the stun of the resistances in the conductive wires 222b and 224b are substantially the same as the sum of the resistances in the conductive wires 222a and 224a, the reference current $I_{REF1}$ will be substantially the sane or equal to the reference current $I_{REF2}$.

Figure 6:
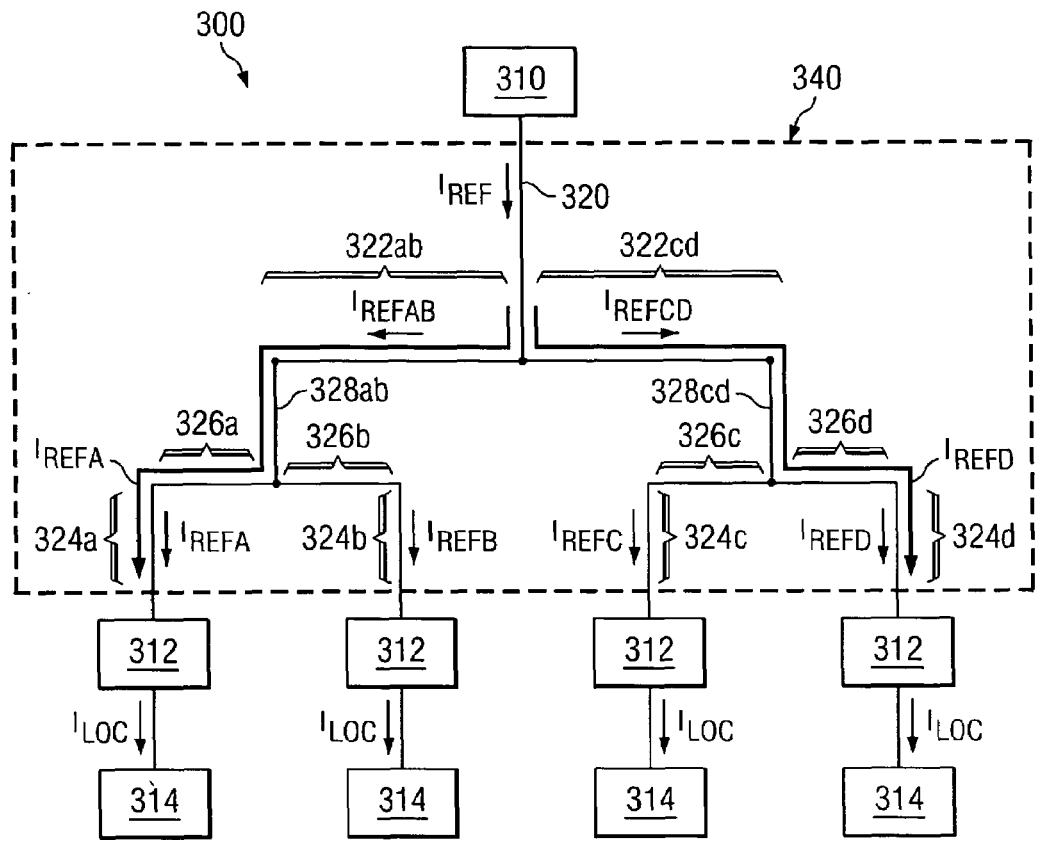
FIG. 6 shows another embodiment of the present invention with a GCRG coupled to a plurality of LCGs, wherein the LCGs are arranged in a row or column and wherein the resistance for the reference conductive lines is substantially the same regardless of the distance between the GRCG and the LCGs.

FIG. 6 illustrates another embodiment of the present invention wherein a GCRG 310 of an MRAM array 300 generates a current that is evenly distributed to a plurality (e.g., three or more) of LCGs 312 through a conductive wire segment configuration 340. In this embodiment, the GCRG 310 generates a current that is evenly distributed to four LCGs 312. Each LCG 312 is coupled to at least one sub-array 314, as shown. A reference current $I_{REF}$ generated by the GRCG 310 flows along conductive wire segment 320 and is distributed into the conductive wire segments 322ab and 322cd. The lengths of conductive wire segments 322ab and 322cd are substantially the same, the lengths of conductive wire segments 328ab and 328cd are substantially the same, the lengths of conductive wire segments 326a, 326b, 326c and 326d are substantially the same, and the lengths of conductive wire segments 324a, 324b, 324c and 324d are substantially the same, as shown. The sum length of wire segments 320, 322ab, 328ab, 326a and 324a through which $I_{REFA}$ flows is substantially the same as the sum length of wire segments 320, 322ab, 328ab, 326b and 324b through which $I_{REFB}$ flows. The sum length of wire segments 320, 322cd, 326c and 324c through which reference current $I_{REFC}$ flows is equal in length to the sum length of wire segments through which $I_{REFA}$ and $I_{REFB}$ flow. The sum length of wire segments 320, 322cd, 328cd 326d and 324d through which reference current $I_{REFD}$ flows is equal in length to the sum length of wire segments through which $I_{REFA}$, $I_{REFB}$ and $I_{REFC}$ flow. Given that the four reference currents $I_{REFA}$, $I_{REFB}$, $I_{REFC}$ and $I_{REFD}$ flow through substantially the same length of wire (leading to the same resistance) and have the same source, the four reference currents $I_{REFA}$, $I_{REFB}$, $I_{REFC}$ and $I_{REFD}$ are substantially the same.

Figure 7:
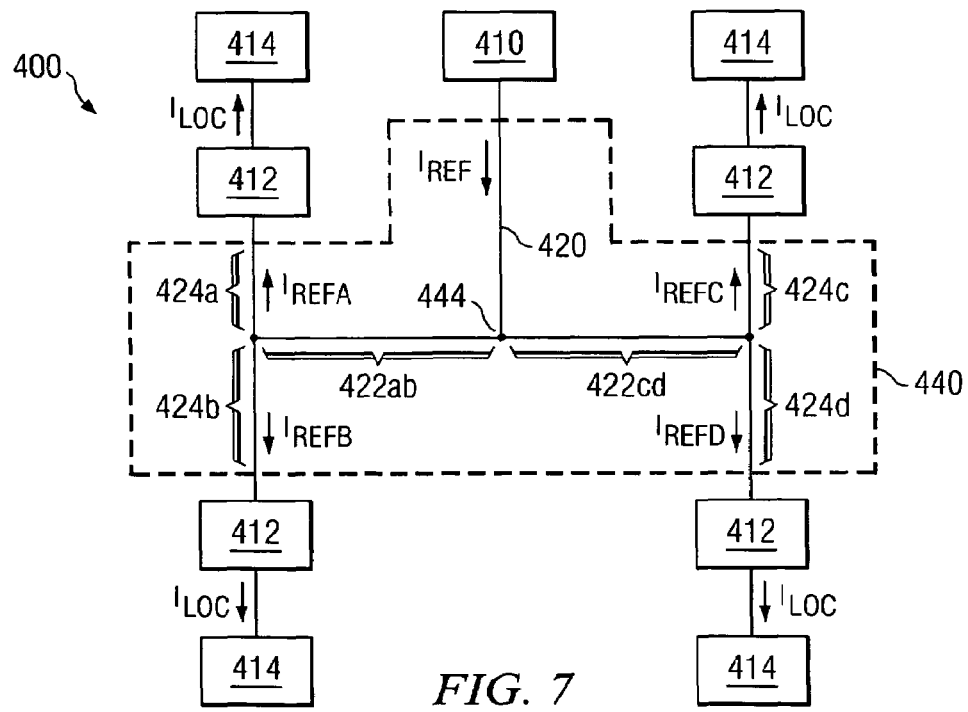
FIG. 7 shows yet another embodiment of the present invention with a GCRG coupled to a plurality of LCGs, wherein the LCGs are arranged in a plurality of rows and columns, and wherein the resistance for the reference conductive lines is substantially the same, regardless of the distance between the GRCG and the LCGs.

In FIG. 7, another embodiment of the present invention is shown, wherein a GCRG 410 generates a current that is evenly distributed to four LCGs 412 through a conductive wire segment configuration 440. In this embodiment, The LCGs 412 are arranged in a set of rows and columns, each being coupled to at least one sub-array 414. A reference current $I_{REF}$ generated by the GRCG 410 flows along conductive wire segment 420 and is distributed into a central portion 444 of the MRAM array 400. The wire segment 420 is coupled to wire segments 422ab and 422cd at the central portion 444 of the MRAM array 400, as shown. The reference current $I_{REF}$ generated by the GRCG 410 flows along conductive wire segment 420 into the conductive wire segments 422ab and 422bc. The lengths of conductive wire segments 422ab and 422cd are substantially the same, and the lengths of conductive wire segments 424a, 424b, 424c and 424d are substantially the same. The sum length of wire segments 420, 422ab, and 424a through which $I_{REFA}$ flows is substantially the same as the sum length of wire segments 420, 422ab, and 424b through which $I_{REFB}$ flows. The sum length of wire segments 420, 422cd, and 424c through which $I_{REFC}$ flows is substantially the same as the sum length of wire segments 420, 422cd, and 424d, through which $I_{REFB}$ flows $I_{REFD}$ flows. The sum length of wire segments through which $I_{REFA}$, $I_{REFB}$, $I_{REFC}$ and $I_{REFD}$ flow are substantially the same. Therefore, the current paths for the reference current inputs to the LCGs 412 have substantially the same resistance. Given that the four reference currents $I_{REFA}$, $I_{REFB}$, $I_{REFC}$ and $I_{REFD}$ flow through substantially the same length of wire and have the same source, the four reference currents $I_{REFA}$, $I_{REFB}$, $I_{REFC}$ and $I_{REFD}$ are substantially the same.

Figure 8:
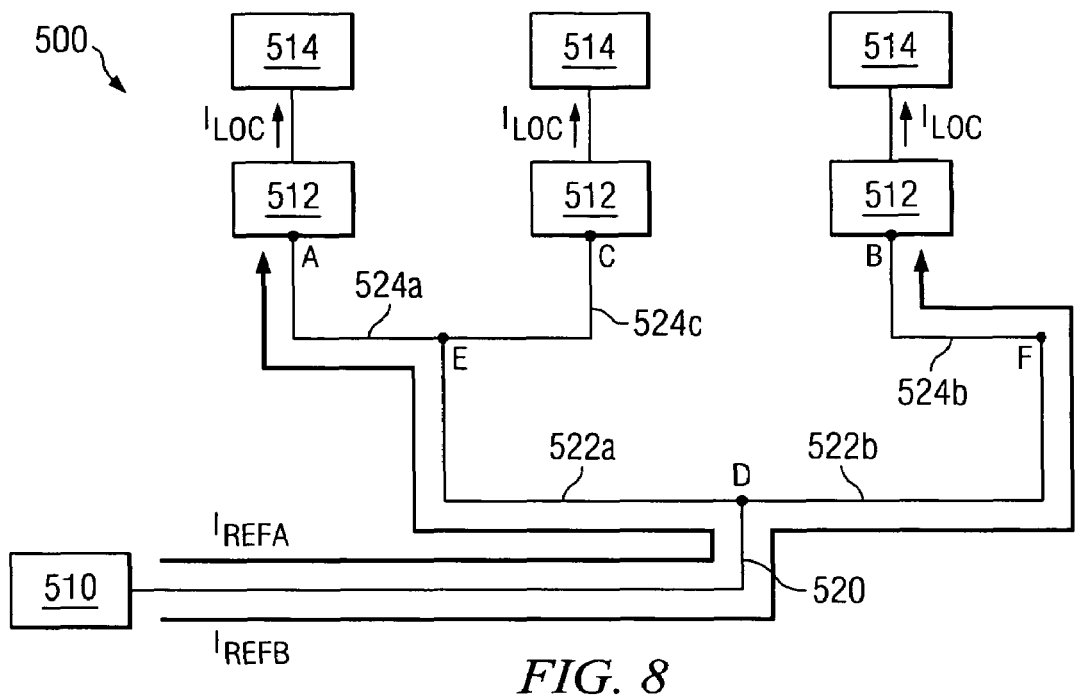
FIG. 8 illustrates a configuration of conductive wire segments, which distribute substantially the same amount of current to an odd number of LCGs.

For the case in which an odd number of local current generators (LCGs) 512 exist in an MRAM array 500, conductive wire segments can be configured as shown in FIG. 8 to distribute current in a substantially uniform amount to each LCG 512. $I_{REFA}$ flows from the GRCG 510, along the wire segments 520 and 522a, and into the LCG 512 coupled to wire segment 524a at point A. $I_{REFB}$ flows from the GRCG 510, along the wire segments 520 and 522b, and into the LCG 512 coupled to wire segment 524b at point B. Wire segment 522a, which is coupled to wire segments 520 and 522b at point D and wire segment 524a at point E, is the same length as wire segment 522b, which is coupled to wire segments 520 and 522a at point D and wire segment 524b at point F. Similarly, wire segment 524a, which is coupled to wire segments 522a and 524c at point E, is the same length as wire segment 524b, which is coupled to wire segment 522b at point F.

Figure 9:
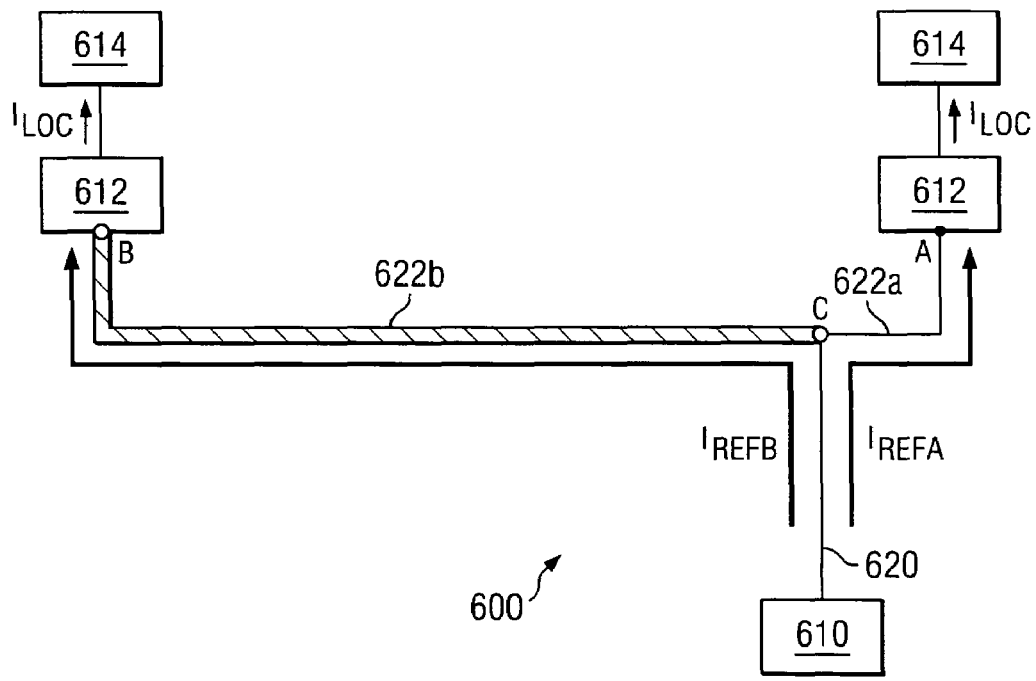
FIG. 9 illustrates a conductive wire segment configuration distributing substantially the same amount of reference current to two LCGs in which the resistance of two current paths are substantially the same but the lengths and widths of the conductive wire segments are not the substantially the same.

The GRCG 610 in the memory array 600 shown in FIG. 9 provides a current to the LCGs 612. Wire segment 622b is longer than wire segment 622a, however segment 622b is wider than segment 622a as illustrated in FIG. 9 by a thicker drawn line connecting points C and B. Wire segment 622b is wider than the width of segment 622a such that the cumulative resistance encountered by the reference current $I_{REFB}$ flowing from point C to point B is substantially the same as the resistance encountered by reference current $I_{REFA}$ flowing through wire segment 622a from point C to point A. Since the resistance in the wire segments through which current $I_{REFA}$ flows is substantially the same as the resistance in the wire segments along which $I_{REFB}$ flows, and both currents are from the same GRCG 610, then both currents $I_{REFB}$ and $I_{REFA}$ supplying the LCGs are substantially the same.

While only two LCGs 212 are shown in FIG. 5, only four LCGs 312 and 412 are shown in FIGS. 5 and 6, respectively, the MRAM arrays 200, 300, 400, 500, and 600 may alternatively comprise 128, 256 or more LCGs. For example, an array may include 128, 256, or 512 sub-arrays and LCGs. Regardless of the number of LCGs 212, 312, 412, 512, and 612, the length of the reference current paths between the GRCG 210, 310, 410, 510, and 610 and the LCGs 212, 312,412, 512, and 612, are substantially the same within each array configuration 240, 340, 440, 540, 640, as described with reference to the embodiments herein. The chip may further include more than one global source, where each global source supplies a reference current to one or more of the local current sources.

In accordance with one embodiment of the present invention, the reference current paths 220, 320, and 420, 520, 620, preferably are formed in a single interconnect layer, e.g. a metallization layer of the MRAM device. However, the reference current paths 220, 320, and 420, 520, and 620 may alternatively be formed in a plurality of layers. The reference current paths 220, 320 420, 520, and 620, preferably comprise a metal such as copper, aluminum or combinations thereof, for example, reference current paths 220, 320 and 420, 520, and 620, although alternatively, the reference current paths 220, 320 and 420 may comprise other conductive materials.

Embodiments of the present invention achieve technical advantages by providing a reference current distribution for an MRAM array wherein the reference current at the input of each LCG 212,312,412, 512, and 612 is substantially the same. Because the resistance and length of the reference current path between the GRCG 210, 310, 410, 510, and 610, and the LCGs 212, 312,412, 512, and 612, are substantially the same respectively, the reference current is also the same. Equal reference current distribution in an MRAM array is provided by embodiments of the present invention, resulting in more reliable write operations and an increased write margin.

Although embodiments of the present invention and the advantages thereof have been described in detail, it should be understood that various changes, substitutions and alterations can be made herein without departing from the spirit and scope of the invention as defined by the appended claims. As another example, it will be readily understood by those skilled in the art that LCG configurations, reference current conductive path segment configurations, and reference conductive path materials may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
a plurality of circuit sections;
a plurality of local current generator (LCG), each LCG being coupled to at least one of the circuit sections; and
a global reference current generator (GRCG), each LCG being coupled to the GRCG through a plurality of conductive lines, wherein the resistance of the conductive lines between each LCG and the GRCG is substantially the same.

2. The memory device according to claim 1, wherein the length of the conductive lines between each LCG and the GRCG is substantially the same.

3. The memory device according to claim 1, wherein a reference current sent from the GRCG to the plurality of LCGs is substantially the same at an input of each LCG.

4. The memory device according to claim 1, wherein the plurality of conductive lines comprises a first segment, a second segment coupled to the first segment, and a third segment coupled to the first segment and second segment, wherein the plurality of LCGs comprises a first LCG and a second LCG, wherein the first segment and the second segment are coupled between the first LCG and the GRCG, wherein the first segment and the third segment are coupled between the second LCG and the GRCG, and wherein the resistance of second segment and third segment are substantially equal.

5. The memory device according to claim 4, wherein the length of the second segment is substantially equal to the length of the third segment.

6. The memory device according to claim 1, further comprising plurality of sub-arrays that including a plurality of magnetic memory cells, wherein the memory device comprises a magnetic random access memory (MRAM) device.

7. The memory device according to claim 1, wherein the plurality of conductive lines are formed in a single material layer of the memory device.

8. The memory device according to claim 1, wherein the plurality of conductive lines are formed in a plurality of material layers of the memory device.

9. The memory device according to claim 1, wherein the plurality of conductive lines comprise copper, aluminum or combinations thereof.

10. The memory device according to claim 1, wherein the LCGs are arranged in columns or rows.

11. A magnetic random access memory (MRAM) device, comprising;
a plurality of sub-arrays, each sub-array comprising:
a plurality of magnetic memory cells;
a plurality of first conductive lines disposed beneath the magnetic memory cells, the first conductive lines being positioned in a first direction; and
a plurality of second conductive lines disposed above the magnetic memory cells, the second conductive lines being positioned in a second direction;
a local current generator (LCG) coupled to each sub-array; and
a global reference current generator (GRCG) coupled to each local current generator through a plurality of third conductive lines, wherein the resistance of the third conductive lines between each LCG and the GRCG is substantially the same.

12. The MRAM device according to claim 11, wherein the length of the third conductive lines between each LCG and the GRCG is substantially the same.

13. The MRAM device according to claim 11, wherein a reference current sent from the GRCG to the plurality of LCGs is substantially the same at an input of each LCG.

14. The MRAM device according to claim 11, wherein the plurality of third conductive lines comprises a first segment a second segment coupled to the first segment, and a third segment coupled to the first segment and second segment, wherein the plurality of LCGs comprises a first LCG and a second LCG, wherein the first segment and the second segment are coupled between the first LCG and the GRCG, wherein first segment and the third segment are coupled between the LCG and the GRCG, and wherein the resistance of the second segment and the third segment are substantially equal.

15. The MRAM device according to claim 14, wherein a first write current generated by the first LCG is substantially equal to a second write current generated by the second LCG.

16. The MRAM device according to claim 14, wherein the length of the second segment is substantially equal to the length of the third segment.

17. The MRAM device according to claim 11, wherein the plurality of third conductive lines are formed in a single material layer of the MRAM device.

18. The MRAM device according to claim 11, wherein the plurality of third conductive lines are formed in a plurality of material layers of the MRAM device.

19. The MRAM device according to claim 11, wherein the plurality of third conductive lines comprise copper, aluminum or combinations thereof.

20. The MRAM device according to claim 11, wherein the LCGs are ranged in columns or rows.

21. In a semiconductor memory device comprising a plurality of local current generator (LCGs) coupled to a global reference current generator (GRCG), a method of distributing current comprises:
flowing current through a first current path from the GRCG to a first LCG; and
flowing current through a second current path from the GRCG to a second LCG, the second current path having the same resistance as the first current path.

22. The method according to claim 21, wherein the second current path has the same length as the first current path.

23. The method according to claim 21, further comprising:
flowing current through a third current path from the GRCG to a third LRCG circuit, the third current pat having the same resistance as the first and second current paths; and
flowing current through a fourth current path from the GRCG to a fourth LRCG circuit, the fourth current path having the same resistance as the first, second and third current paths.

24. The method according to claim 23, wherein the second current path, the third current path and the fourth current path have the same length as the first current path.

25. The method according to claim 23, wherein the first and second current paths are coupled at a first point, and wherein the third and fourth current paths are coupled at a second point.

26. The method according to claim 25, wherein the first and second current paths are coupled with the third and fourth current paths at a third point.

27. The method according to claim 21, wherein the first and second current paths are coupled at a first point.

* * * * *

UNITED STATES PATENT AND TRADEMARK OFFICE
CERTIFICATE OF CORRECTION

PATENT NO. : 6,972,989 B2  
DATED : December 6, 2005  
INVENTOR(S) : Lammers

Page 1 of 1

It is certified that error appears in the above-identified patent and that said Letters Patent is hereby corrected as shown below:

Column 9,  
Line 16, delete "including" insert -- include --.  
Line 55, delete "segment a" insert -- segment, a --.

Column 10,  
Line 23, delete "ranged" insert -- arranged --.  
Line 38, delete "pat" insert -- path --.

Signed and Sealed this

Twenty-eighth Day of February, 2006

JON W. DUDAS  
*Director of the United States Patent and Trademark Office*